United States Patent [19]
Snyder et al.

[11] Patent Number: 5,013,531
[45] Date of Patent: May 7, 1991

[54] MACROMOLECULAR CRYSTAL GROWING SYSTEM

[75] Inventors: Robert S. Snyder, Huntsville; Blair J. Herren, Arab; Daniel C. Carter; Vaughn H. Yost, both of Huntsville; Charles E. Bugg; Lawrence J. DeLucas, both of Birmingham, all of Ala.; Fred L. Suddath, Marietta, Ga.

[73] Assignee: The United States of America as represented by the Administrator of the National Aeronautics and Space Administration, Washington, D.C.

[21] Appl. No.: 575,736

[22] Filed: Aug. 31, 1990

[51] Int. Cl.⁵ .............................. B01D 9/00
[52] U.S. Cl. .................... 422/245; 422/247; 156/DIG. 62; 156/DIG. 113
[58] Field of Search ............... 156/DIG. 62, DIG. 93, 156/DIG. 113; 422/245, 247, 236

[56] References Cited
U.S. PATENT DOCUMENTS 4,917,707 4/1990 Claramonte et al. ...... 156/DIG. 113
4,919,900 4/1990 Martin et al. ............. 156/DIG. 113

OTHER PUBLICATIONS

*The Huntsville Times*, Sunday, Sep. 27, 1987, Science Section, p. 19A.
*NASA Microgravity*, Jan. 1988, 2 pages.
*Journal of Crystal Growth* 76 (1986), pp. 681-693, North-Holland, Amsterdam.

Primary Examiner—Olik Chaudhuri
Assistant Examiner—Felisa Garrett-Meza
Attorney, Agent, or Firm—Jerry L. Seemann; William J. Sheehan; Robert L. Broad, Jr.

[57] ABSTRACT

A macromolecular crystal growing system especially designed for growing crystals in the low gravity of space as well as the gravity of earth includes at least one tray assembly, a carrier assembly which receives the tray, and a refrigeration-incubation module in which the carrier assembly is received. The tray assembly includes a plurality of sealed chambers with a plastic syringe and a plug means for the double tip of the syringe provided therein. Ganging mechanisms operate the syringes and plugs simultaneously in a precise and smooth operation. Preferably, the tray assemblies are mounted on ball bearing slides for smooth operation in inserting and removing the tray assemblies into the carrier assembly. The plugging mechanism also includes a loading control mechanism. A mechanism for leaving a syringe unplugged is also provided.

17 Claims, 7 Drawing Sheets

FIG. 5
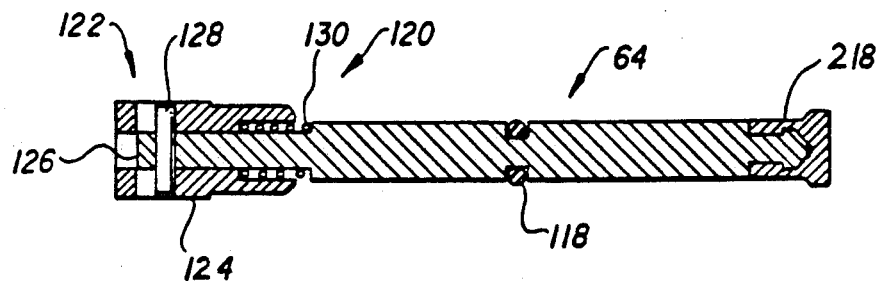
FIG. 6
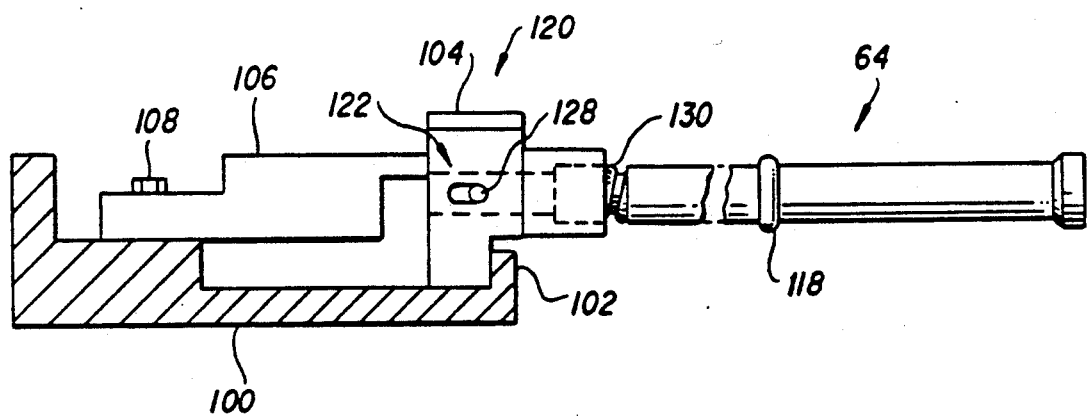
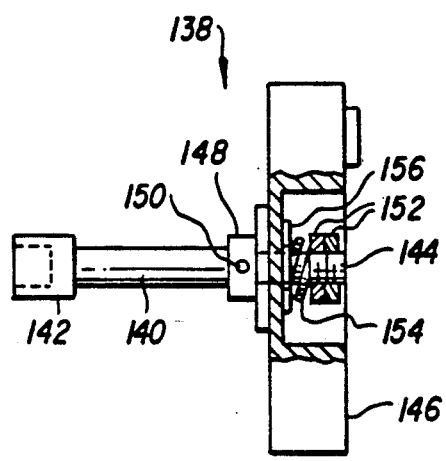
FIG. 7

MACROMOLECULAR CRYSTAL GROWING SYSTEM

ORIGIN OF THE INVENTION

The invention described herein was made, in part, by employees of the United States Government and may be manufactured and used by or for the Government for governmental purposes without the payment of any royalties thereon or therefore.

FIELD OF THE INVENTION

The present invention relates generally to a crystal growing system, and more particularly to a macromolecular crystal growing system for growing crystals in both the gravity of earth and the low gravity of space.

BACKGROUND OF THE INVENTION

Knowledge of proteins is important in drug design, protein engineering, and material science. For example, knowing the precise structure of such complex molecules provides a key to understanding their biological function and can lead to methods of altering or controlling the function in ways that result in new drugs or better drugs.

It is through sophisticated x-ray diffraction analysis of a protein in crystallized form that scientists are able to construct a model of the molecular structure of a protein. Unfortunately, protein crystals grown on earth are often small and flawed. However, it has been shown on previous space shuttle missions that protein crystals grown in low gravity can produce superior crystals for such analysis. In particular, in low gravity environments of the orbiting space shuttle, the effects of sedimentation and convection are nearly eliminated during crystal growth of such proteins.

One article describing a previous low gravity system for growing crystals was carried in the *Huntsville Times* on Sept. 27, 1987 and entitled "Next Shuttle Flight to Carry Alabama Experiments". This article described a device in which twenty sample chambers were provided. By operation of a crank, plugs for the double barreled syringes in the chambers were simultaneously moved from the double barrel tips while the contents of the syringes were pushed from the tip. A separate reservoir was provided into which water was drawn to concentrate the protein in the droplets formed at the end of the tip. Upon completion of the experiment, the crank was then turned in the opposite direction to simultaneously withdraw the solution back into the syringe and plug the syringe for the flight back to earth.

Another disclosure of a protein crystal growth experiment apparatus is contained in a NASA/Marshall Space Flight Center handout dated January, 1988. This handout discloses the use of a vapor diffusion apparatus tray loaded in a carrier which is then mounted in a refrigerator-incubator module. The vapor diffusion apparatus tray contains twenty experiments with each experiment chamber having a protein solution and a precipitant solution held in two separate barrels of a syringe. The solutions are extruded from the syringe to form a single drop which then hangs suspended over a reservoir of precipitant solution of higher concentration. A ganging mechanism operates the twenty experiments in each tray simultaneously. After a predetermined growth period, the droplets are retracted into the syringe and the syringe can be plugged or left unplugged.

SUMMARY OF THE INVENTION

In accordance with the present invention, a macromolecular crystal growing system for growing crystals in both the gravity of earth and in particular the low gravity of space includes at least one and preferably three tray assemblies. A carrier assembly is then provided with a tray receiver means for removal or receiving each tray assembly. A refrigeration-incubation module includes a carrier assembly receiver means for removing or receiving each tray assembly. The refrigeration-incubation module is temperature controlled by a suitable temperature control means. Finally, a cranking tool is provided by which the crystal growing is initiated and terminated.

Each tray assembly includes a planar base and a plurality of sealed chambers mounted on this base and extending along the long axis (hereinafter called axis). A double barreled plastic syringe containing crystal growing solutions extends into one side of each chamber parallel to the base. A piston is provided in each barrel. The proximal end of a respective rod is connected to each respective piston and the distal end extends parallel to the base out of the barrel. In each chamber, a plug means is also provided for sealing the double tip. This plug means includes a plug rod extending into an opposite side of the chamber parallel to the base toward the double tip. A plug is located on the proximal end of each plug rod to resiliently seal against the double tip. The distal end of the plug rod is then located outside of the chamber. A reservoir material is also provided in each chamber which contains a solution causing crystal growth when the crystal growing solutions are extruded from the double tip.

Each tray also includes a first ganging means for moving all of the pistons of all of the syringes simultaneously as well as a second ganging means for moving all of the plugs for all of the syringes simultaneously. Each ganging means includes a tiebar extending parallel to the axis and slidably mounted to the base for movement toward and away from the chambers. A connecting means connects the piston rods or plug rods to the associated tiebar. A moving means is then provided for each tiebar to move the tiebar toward and away from the chambers. The moving means includes a longitudinal rack having a threaded end which extends parallel to the axis, and associated rack blocks through which the longitudinal rack extends. These rack blocks include a first pinion means for engaging the longitudinal rack. A lateral rack also extends out of each rack block and is attached to the tiebar. Each lateral rack also engages the first pinion means so that movement of the longitudinal rack causes a corresponding movement of the lateral rack. A screw block is also mounted to the base adjacent the threaded end of the longitudinal rack. A rack screw then threadably engages the screw block and has a proximal end adapted for engagement with the cranking tool and a distal end which threadably mates with the threaded end of the longitudinal rack.

Preferably, the reservoir provided in each chamber is an ultra-high molecular weight polyethylene In addition, each chamber also includes a viewing axis for the double tip which is perpendicular to the planar base. This viewing axis is provided by viewing windows on opposite sides of the chamber. A first through hole and first sealing means for the through hole are provided for access to the double tip. A second through hole and second sealing means are also provided for access to the reservoir.

In a preferred embodiment, the tray receiver means of the carrier assembly includes a pair of ball bearing slides. Each slide is mounted on an opposite side of the carrier assembly so that the tray assembly is mounted thereto and freely slidable into and out of the carrier assembly by movement with the slides. Each slide preferably has an extended length outside of the carrier assembly which is greater than 150% of the length of the tray assembly.

The cranking tool includes a handle and an engagement member. A slipping means is then provided to connect the handle to the engagement member. The slipping means limits the torque which is transmitted from the handle to the engagement member.

In the preferred embodiment, the plug rod includes a loading control means whereby the plug is forced against the double tip with a predetermined pressure. This loading and control means includes a lost motion means between the distal end and proximal end of the plug rod for providing a limited length of free travel therebetween. A spring means then urges the proximal end away from the distal end with a predetermined force over the limited length of free travel.

If desired, each tray assembly can include a plurality of sealed chambers on each side of the planar base.

The crystal growing system of the present invention preferably also includes a transport assembly for each syringe whereby the syringe is transported to the chamber after the syringe is loaded with the crystal growing solution. This transport assembly includes a resilient cap for the double tip and a retainer means for prevent movement of the piston rods of the syringe after loading of the syringe and during transport and installation of the syringe on the tray assembly.

In the preferred embodiment, the connecting means for each plug rod preferably includes a lip on the associated tiebar which engages a lip provided at the distal end of the plug rod when the tiebar is moved away from the chambers. A pusher member is then provided on the tiebar which pushes against the distal end of the plug rod as the tiebar is moved towards the chambers. A mounting means mounts these pusher members to the base for movement between an engaging position whereby the pusher member engages the distal end of the push rod as the tiebar is moved towards the chambers and a disengaged position whereby the pusher member is free from engagement with the distal end of the plug rod as the tiebar is moved towards the chambers.

Other features and advantages of the present invention are stated in or apparent from a detailed description of the presently embodiments of the invention found hereinbelow.

BRIEF DESCRIPTION OF THE DRAWINGS

FIG. 5 is a cross-sectional top view of a plug rod used on a tray assembly.

FIG. 6 is a side elevation view of the plug rod depicted in FIG. 5 mounted on a tiebar.

FIG. 7 is a partially cut away side view of a crank tool used with the tray assembly.

FIG. 8' is a perspective view of an alternative tip for a syringe according to the present invention.

DETAILED DESCRIPTION OF THE PREFERRED EMBODIMENTS

The general purpose of the present invention is to grow crystals of macromolecules in both the gravity of earth and especially the low gravity of space. In order to facilitate an understanding of the present invention, the methods of macromolecular crystal growth are also disclosed and depicted in FIGS. 1(a)-1(d).

Figure 1A:
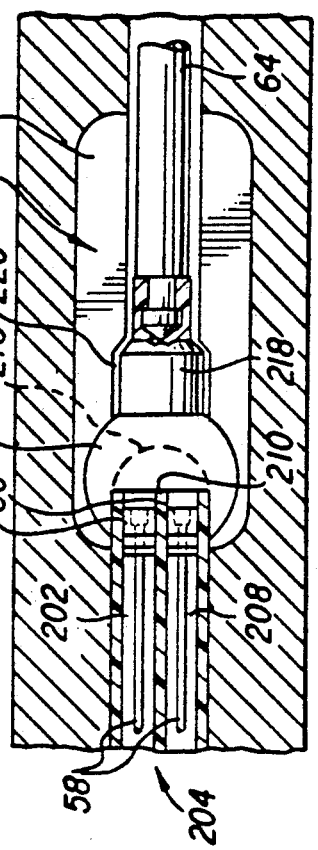
FIGS. 1(a)-1(d) are schematic cross-sectional top views of a chamber showing the crystal growing steps according to the present invention.

One method is by the vapor transport of water to increase the concentration of a precipitating agent and a protein in a protein drop. As shown in FIG. 1(a), this is accomplished by initially providing a protein solution 200 in one barrel 202 of a double barreled syringe 204 and a precipitating solution 206 in the other barrel 208 of syringe 204. The double barreled syringe tip 210 having a "double-D" end configuration is then located in a chamber 212 containing a reservoir material 214. Reservoir material 214 is preferably an ultra-high molecular weight polyethylene, but it could also be a porous glass, cellulose, or other inert material as appropriate. Reservoir material 214 is saturated with the same precipitating solution as 206, but this reservoir precipitating solution has a higher concentration of precipitating agent than the solution to be made by combining the protein solution 200 and the precipitating solution 206. A plug 218 is also provided against double tip 210 to prevent water transport from either precipitating agent solution 206 in one barrel 208 or protein solution 200 in the other barrel 202 to the reservoir precipitating solution in reservoir material 214 before activation.

Figure 1B:
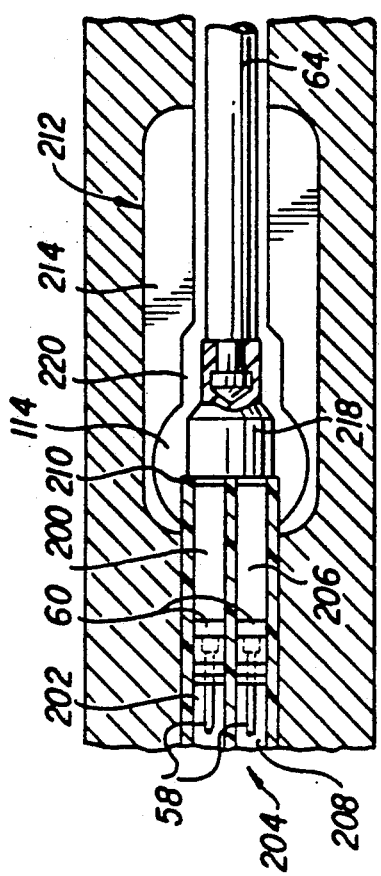

When activated, as shown in FIG. 1(b), plug 218 is retracted into a hole 220 provided in reservoir material 214 and the protein solution 200 and precipitating agent solution 206 are extruded to form a single 30 to 80 microliter drop 216. This drop 216 has a lower concentration of precipitating agent than the precipitant solution in reservoir material 214.

Figure 1C:
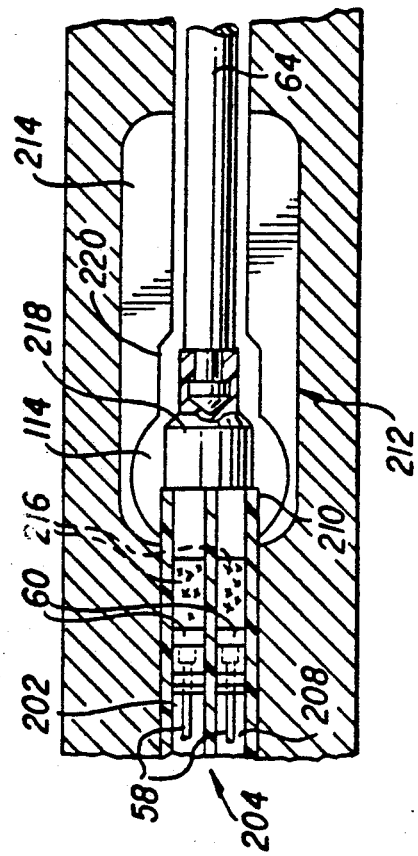

Thus, water moves by vapor transport from protein solution drop 216, which also contains the precipitating agent, to the reservoir precipitant solution until vapor pressure equilibrium is achieved as shown in FIG. 1(c). As the concentration of precipitating agent and protein increases in protein drop 216, crystallization starts either before equilibrium or at equilibrium of the vapor pressures. One reason why crystallization can start before equilibrium is the protein and precipitating agent of drop 216 may not be uniformly mixed. This produces local concentrations of the protein and/or precipitating agent of drop 216 which can be sufficient to cause crystallization. Other reasons are that nucleation sites can be provided by impurities in the protein solution, seeding of the protein solution with a crystal can be provided, or roughness of the syringe tip surface, inner edge, and/or outer edge can also provide nucleation sites.

Figure 1D:
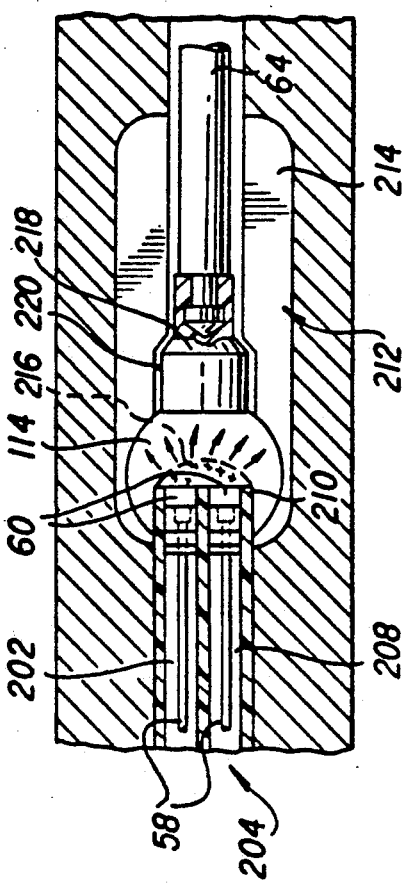

After crystal growth is completed, or must be stopped because the low-g period will end with the deceleration required to leave earth orbit, the protein solution with the crystal(s) suspended therein is drawn into the barrels of the syringe as shown in FIG. 1(d). Growth chamber 212 is then preferably inspected to see if there are protein crystals attached to syringe tip 210 in such a way that they would be crushed by returning plug 218 to syringe tip 210. If this is not the case, plug 218 is then returned to syringe tip 210. This prevents further vapor transport and loss of protein solution and crystals from syringe barrels 202 and 208. However, if there are crystals which would be damaged by the use of plug 218, tip 210 can be left unplugged.

Another method of growing crystals is vapor transport to change the pH in the protein drop. This method is performed in a manner similar to that described above, except the crystallization process depends on a change in the pH of the protein solution drop which is by transport of volatile pH determining solutes such as ammonia or acetic acid. Thus, prior to activation, a protein and volatile pH determining solute (such as a base) are placed in separate barrels of the double barreled syringe. The reservoir material then is saturated with a volatile pH determining solute (such as an acid). The plug then prevents pH determining solute transport between the solutions in the syringe barrels and the solution in the reservoir which would cause an acid-base reaction and the drop pH to approach that of the other reservoir. Then, when the plug is retracted for activation, a pH equilibrium in the chamber is achieved and crystal growth commences. Crystallization may start before equilibrium, or at equilibrium of the pH between the protein drop and reservoir.

While a double barreled syringe has been described, it should be appreciated that there may be situations where only a single barrel syringe is preferred. In addition, while a rubber piston and polysulphone barrel with some grease for the piston is preferred, the use of grease can be avoided by using a teflon piston and a glass barrel. However, the glass barrel tip does provide additional undesired nucleation sites. Further, stainless steel pistons with two o-rings are also possible.

Figure 2:
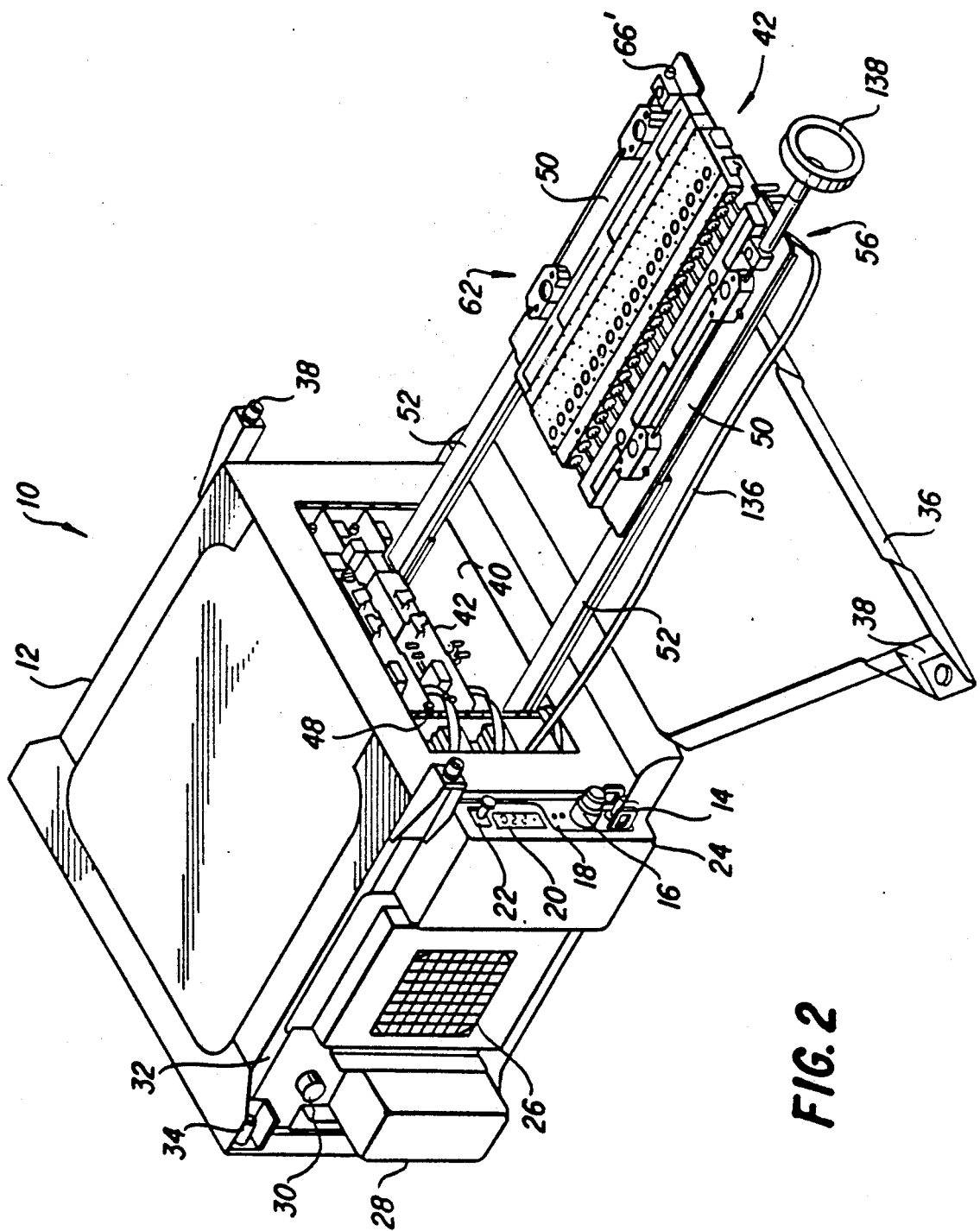
FIG. 2 is a schematic perspective view of the growing system of the present invention.

With reference to the drawings in which like numerals represent like elements through the views, a macromolecular crystal growing system 10 is depicted in FIG. 2. Growing system 10 includes a refrigerator-incubator module 12 whose main purpose is to control the temperature of the air therein throughout the growing process. Tests have shown that for a set point of 22° C. and ambient temperature of 27° C., the air is controlled to ±0.2° C. Module 12 is particularly adapted to mount in place of a standard modular storage locker on the mid deck forward bulk head of the space shuttle. However, it should be appreciated that module 12 can be positioned at other locations as desired. It should also be appreciated that module 12 helps to provide protection against accelerations and decelerations which might be caused by handling, bumping, or the like and which might cause the drops to separate from the syringe tips.

As shown in FIG. 2, module 12 includes a power switch 14, a temperature set adjustment 16, heat and cool duty cycle light indicators 18, temperature display 20, and circuit breaker 22 all housed in a control electronics housing 24. A temperature logger is also provided which includes three thermistors for each tray assembly (discussed subsequently) so that the temperatures can be periodically measured and recorded. Behind housing 24 is a cooling fan 26 and a solid state relay housing 28. A power input connector 30 is provided above relay housing 28 and adjacent electromagnetic interference (EMI) filter compartment 32. Standard storage locker mounting sleeve bolts 34 are provided at the four back corners of module 12. At the front of module 12, a door 36 is provide in which a pressure equalization valve (not shown) as known in the art is provided. In order to latch door 36, standard storage locker door latches 38 are used.

Figure 3:
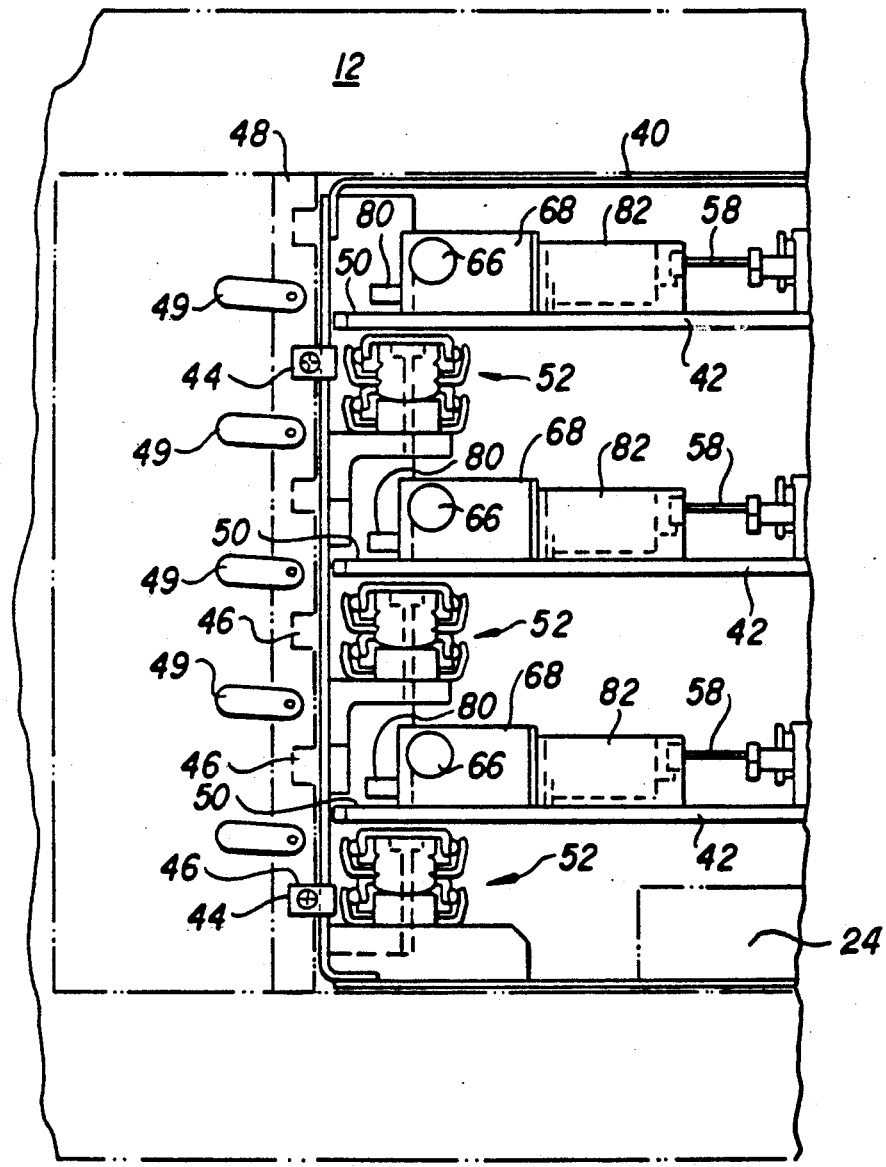
FIG. 3 is a front elevation view of a portion of the carrier assembly depicted in FIG. 2.

Provided in refrigerator-incubator module 12 is a carrier assembly 40 which is shown in greater detail in FIG. 3 where the left hand portion of carrier assembly 40 is depicted. The main purpose of carrier assembly 40 is to fix therein a plurality of tray assemblies 42 inside of module 12. Thus, tray assemblies 42 are not allowed to accelerate of or decelerate with respect to module 12. Another purpose of carrier assembly 40 is to provide a means of holding tray assemblies 42 while the tray assemblies 42 are out of module 12. Carrier assembly 40 includes keys 44 on the side thereof which are received in respective slot 46 in the adjacent wall 48 of module 12. Latches 49 mounted to wall 48 can be moved in position to retain carrier assembly 40 in module 12.

It should be appreciated that carrier assembly 40 holds tray assemblies 42 therein by having the long sides 50 of each tray assembly 42 attached to carrier assembly 40 by means of ball bearing slides 52. Ball bearing slides 52 are similar to those used to support office filing cabinet drawers. When fully extended, as shown in FIG. 2, ball bearing slides 52 permit tray assemblies 42 to be pulled out of carrier assembly 40 about 157% of the length of tray assembly 42. In other words, there is a clearance of 57% of the length of tray assembly 42 between the rear end of the tray assembly and the module 12 front when tray assembly 42 is at the farthest position from carrier assembly 40 on ball bearing slides 52. This provides a sufficient space to photograph crystals growing in tray assembly 42 in all of the chambers 212 therein. Preferably, a latch (not shown) is provided on the left slides which must be released to pull out a tray assembly 42 from carrier assembly 40. In use, the friction between the elements that make up ball bearing slides 52 is sufficient to prevent tray assembly 42 from sliding back into carrier assembly 40 in low gravity. Thus, in low gravity, tray assemblies 42 must be pushed in and pulled out.

Figure 4:
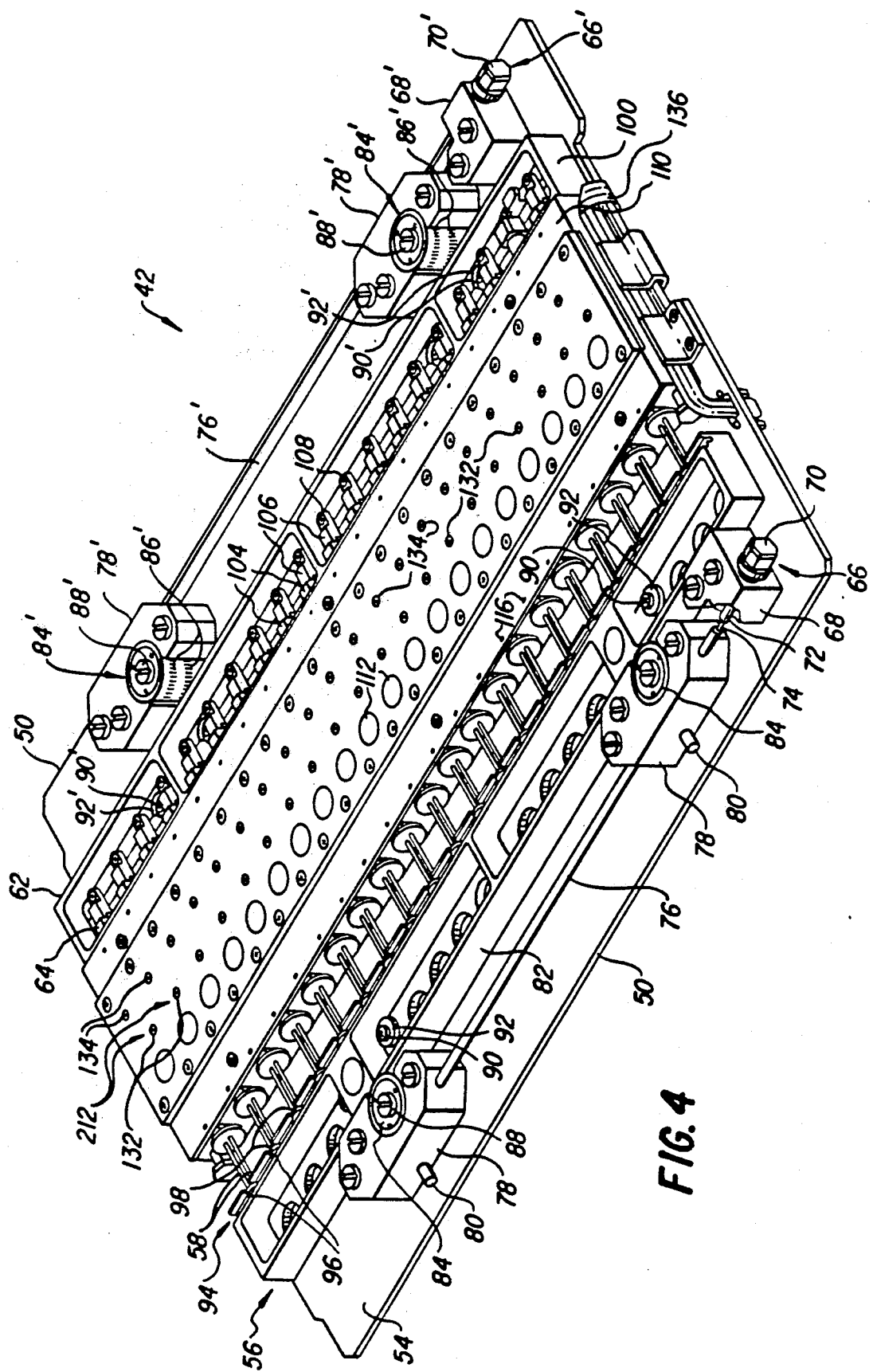
FIG. 4 is a schematic perspective view of a tray assembly depicted in FIG. 2.

As shown in greater detail in FIG. 4, each tray assembly 42 provides a base 54 on which a plurality of sealed chambers 212 are provided along an axis. Also provided on base 54 is a first ganging means 56 which simultaneously move piston rods 58 associated with pistons 60 in each double barreled syringe 204. Located on the other side of chambers 212 is a second ganging means 62 which is used to move all of the plugs 218 in each associated chambers 212 by means of a plug rod 64 to which the associated plugs 218 are attached. As both ganging means 56 and 62 are similar in many respects, the same identifying numerals will be used for corresponding elements, with those of second ganging means 62 being identified with a "'".

First ganging means 56 includes a rack screw 66 which has external right hand threads at 18 threads per inch. Rack screw 66 is received in a screw block 68 which has matching internal threads. Screw block 68 is attached to base 54 by suitable machine screws. Rotation of rack screw 66 causes rack screw 66 to move longitudinally with respect to screw block 68 and parallel to the axis of chambers 212.

Rack screw 66 includes a hexagon shaped end 70 which is adapted to be engaged by a suitable cranking tool. The other end 72 of rack screw 66 has internal left-hand threads at 40 threads per inch. Threadably received in other end 72 is a reduced threaded end 74 of a longitudinal rack 76. Longitudinal rack 76 is mounted for longitudinal movement to base 54 by a pair of rack blocks 78. Rack blocks 78 support and permit only linear movement of longitudinal rack 76. In addition, rack blocks 78 also mount and permit only lateral movement of a lateral rack 80 for each rack block 78. Lateral racks 80 are attached to a first tiebar 82. Disposed in each rack block 78 is a pinion means 84. Pinion means 84 comprises two hubless pinions (see pinions 86' of pinion means 84') which are pinned together and rotate on a pinion screw 88. Pinion screw 88 is attached to base 54 and other machine screws mount rack block 78 to base 54 as well.

It should be appreciated that a very precise moving means is thus provided for first tiebar 82. When rack screw 66 is rotated one revolution, first tiebar 82 then moves precisely 0.08056 inches. This distance is the sum of the movements of rack screw 66 (1/18 inch) plus the simultaneous movement of reduced threaded end 74 (1/40 inch). Thus, this moving means provides both a precise control of first tiebar 82 as well as a large mechanical advantage to achieve such a movement.

It should also be appreciated that first tiebar 82 is attached to base 54 with two machine screws 90 and bronze shoulder bushing 92. Each of these screw bushing combinations pass through associated slots provided in first tiebar 82 so as to permit only lateral movement thereof.

First tiebar 82 includes a narrow channel 94 with twenty U-shaped cutouts 96 provided therein. Piston rods 58 are then provided with ends 98 which are larger in diameter than the width of U-shaped cutouts 96 but slightly thinner than the width of channel 94. Thus, ends 98 are captured in channel 94 so that as first tiebar 82 moves, all of piston rods 58 similarly move in the same direction and distance.

As mentioned above, second ganging means 62 is substantially similar to first ganging means 56. However, second ganging means includes a second tiebar 100 which has an upstanding lip 102 instead of a channel 94 as provided with first tiebar 82. As shown in FIGS. 5 and 6, lip 102 engages a distal end 104 of plug rod 64 when second tiebar 100 is moved away from chambers 212.

In movement in the other direction, a plug latch 106 is mounted to second tiebar 100 by a screw 108. When plug latch 106 is in the position depicted in FIG. 6, a reverse movement of second tiebar 100 pushes plug rod 64 back into chamber 212. However, when it is desired not to plug syringe tip 210 in chamber 212, plug latch 106 can be rotated about machine screw 108 so as not to engage distal end 104 and thus not to move plug rod 64. Thus, each chamber 212 can be selectively left unplugged when desired.

It should be appreciated that plug latches 106 are normally aligned with distal ends 104 so that when second tiebar 100 is driven toward chambers 212, plugs 218 will engage syringe tips 210. However, when protein crystals are attached to syringe tip 210 in such a way that they might be crushed by engagement of plug 218 in that chamber 212, plug latch 106 for that chamber 212 is then simply rotated out of alignment to prevent such engagement.

It should also be appreciated that no such disengagement means is provided for first tiebar 82. This is because it is desired for all syringes 204 to have the protein and precipitating agent solutions extruded from them during activation and drawn back into syringes 204 during deactivation whether the crystals are growing on syringe tip 210 or not. While crystals drawn into barrels 202 and 208 are much more protected from accelerations and decelerations, the use of plug 218 is not necessary if a crystal will be lost anyway by activation of plug 218.

It should further be appreciated that chambers 212 provide growth chambers which are sealed from the ambient air, which can control the exposure of the protein solution to the precipitating agent and precipitant solution, and which can protect the crystals which have been grown. Chambers 212 are provided by use of a chamber block 110 which contains, in this embodiment, twenty growth chambers 212. Reservoir material 214 in each chamber 212 can absorb in excess of 1.4 milliliters precipitant solution. Each chamber 212 is also provided with a top window 112 sealed with a gasket and a bottom window 114 also sealed with a gasket (as shown for simplicity only in FIG. 1d). Bottom windows 114 permit back-lighting for photographing the crystal growth on the tips. Where polarized pictures are to be desired, bottom windows 114 polarize the light and provide one half of a polarizing system with the other one-half of the polarizing system attached to the lens of the camera.

In each chamber 212, double barreled syringe 204 is used to store the protein solution and precipitating agent in separate containers, prior to activation. Then, the solutions are extruded and mixed in drop 216 on syringe tip 210 which provides a smooth surface for drop 216 to adhere to during crystal growth. Subsequently, when the solution is withdrawn back into syringe 204, syringe 204 provides a container for the protein crystals grown and suspended in the solution after deactivation. Two O-rings 222 (see FIG. 8) are used to seal syringe 204 in each chamber 212 and a set screw 116 holds syringe 204 to chamber 212.

During activation, it should be appreciated that silicon rubber pistons 60 are forced toward chamber 212 to extrude the protein and precipitating agent solutions. To accelerate mixing, piston 60 can be moved in and out several times by moving first tiebar 82 in one direction and then the other by rotation in one direction and then the other rack screw 66 with crank 138.

Referring again to FIGS. 5 and 6, it should be appreciated that each plug rod 64 includes an O-ring 118 which engages the hole provided in 110 to seal chamber 212. It should also be appreciated that plug rod 64 includes a loading control means by which plug 218 is forced against syringe tip 210 with a predetermined pressure. Loading control means 120 includes a lost motion means 122 in the form of a distal end 124 which slidably receives the distal end of member 126 of plug rod 64. A pin 128 is located in a slot provided in distal end 124 and passes through distal member 126. Thus, a lost motion is provided over the length of travel of pin 128 in the slot provided in distal end 124. A spring 130 is then provided between proximal end 124 and distal end of member 126 which normally forces distal end of member 126 away from proximal end 124.

When plug rod 64 is moved so that plug 218 is moved into engagement with syringe tip 210 by the movement of second tiebar 100, engagement occurs just before the end of the movement of second tiebar 100 allowed by bronze bushings 92'. Then, as second tiebar 100 reaches the limit of its movement, distal end 124 moves relative to distal member 126 and spring 130 then compresses and exerts a specified force pressing plug 218 against syringe tip 210. The free travel provided also allows a compensation for slight dimensional differences in the parts while still achieving satisfactory sealing.

Each chamber 212 is also provided with a hole for injecting seed crystals into the protein/precipitating drop when desired. This hole is sealed with a suitable screw 132 and associated O-ring. Through holes are also provided at the opposite end of chambers 212 which are sealed by a screw 134 and associated O-ring. This latter through hole is used to inject precipitant solution into reservoir material 214.

As mentioned above, top windows 112 are provided for each chamber 212 to provide a window for observing seeding of protein/precipitating agent solution as well as observing and photographing crystal growth in drops 216. Top windows 112 are provided in an aluminum alloy plate having twenty window holes in which top windows 112 are bonded. This plate is then screwed down on top of a gasket which is compressed to seal the chambers from each other and from the ambient environment.

Bottom windows 114 similarly provide a window in each chamber 212 for backlighting. Bottom windows 114 can also provide one half of a light polarizing system. Each bottom window 114 is similarly located in an aluminum alloy plate. However, a groove is provided in the extra surface of this plate directly over the windows and is the width of the minor diameter of the window holes and runs the length of the plate. A piece of light polarizing film is bonded in this groove with the polarizing axis parallel to the long axis of the plate. The other half of such a polarizing system is attached to the lens of the camera which is used to periodically photograph growth of the crystals through top windows 112.

Typically, each tray assembly 42 is provided with three temperature sensors located on the bottom side of base 54. Information concerning temperature is transmitted via a cable 136 to a temperature logger system contained in housing 24. Thus, the temperatures of each tray assembly 42 can be measured and recorded at predetermined times as desired.

Depicted in FIG. 7 is a cranking tool 138 which is used for rotating hex-shaped end 70 or 70' of ganging means 56 or 62. As shown, cranking tool 138 includes a shaft 140 having a hex-engaging distal end 142 and a threaded end 144 located inside handle 146. Handle 146 is attached to threaded end 144 by being trapped between a fitting 148 having a set screw 150 and two nuts 152 tightened against each other on threaded end 144. Between nuts 152 and handle 146 is located a spring 154 and washer 156. Depending upon the force exerted by spring 154, handle 146 will slip relative to shaft 140. Thus, cranking tool 138 is prevented from applying excessive torque to rack screw 66 and thus moving ganging means 56 or 62 too fast. Moving ganging means 56 too fast might cause the protein and precipitating solutions to be ejected from the barrels with such a velocity as to cause them to be separated from the end of the syringe tip instead of forming a drop on the end of the tip.

Figure 8:
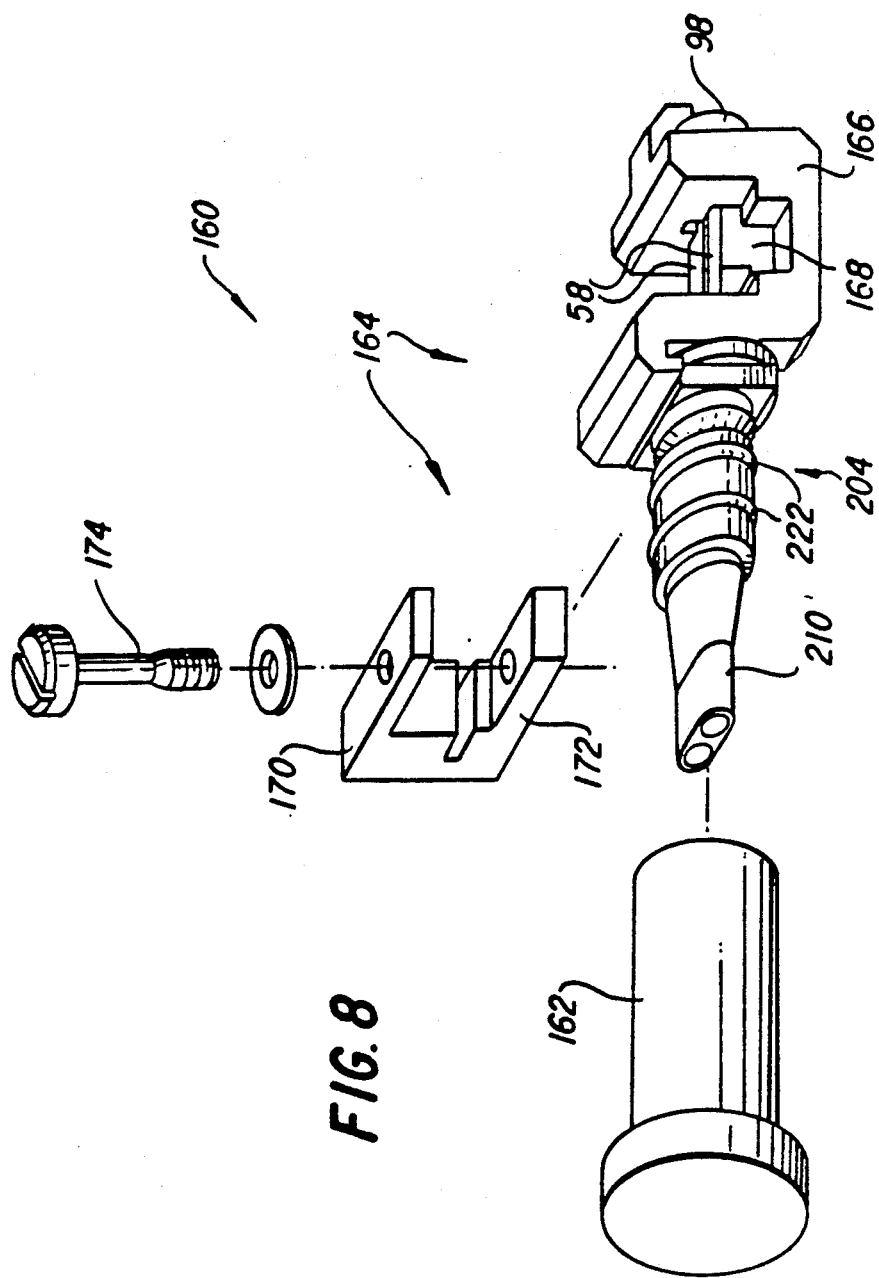
FIG. 8 is an exploded perspective view of a syringe assembly according to the present invention.

Depicted in FIG. 8 is a syringe assembly 160 whereby double barreled syringe 204 can be transported to tray assembly 42 after having been loaded without danger of disturbing the provided solutions. Syringe assembly includes a cap 162 which fits over syringe tip 210. A retainer means 164 is provided to prevent movement of piston rods 58. Retainer means 164 includes a U-shaped retainer base 166 with a central upwardly extending slot 168 which receives piston rods 58. On one side syringe 204 is located and at the other end joining end 98 of piston rods 58 is maintained. To retain piston rods 58 in retainer base 166, a removable stop 170 is provided. Stop 170 includes a foot 172 which is fitted below piston rods 58 and which threadably receives a capture screw 174 to hold stop 170 in place. It should be noted that piston rods 58 can be side by side as depicted, or one on top of the other if so desired.

Figure 9:
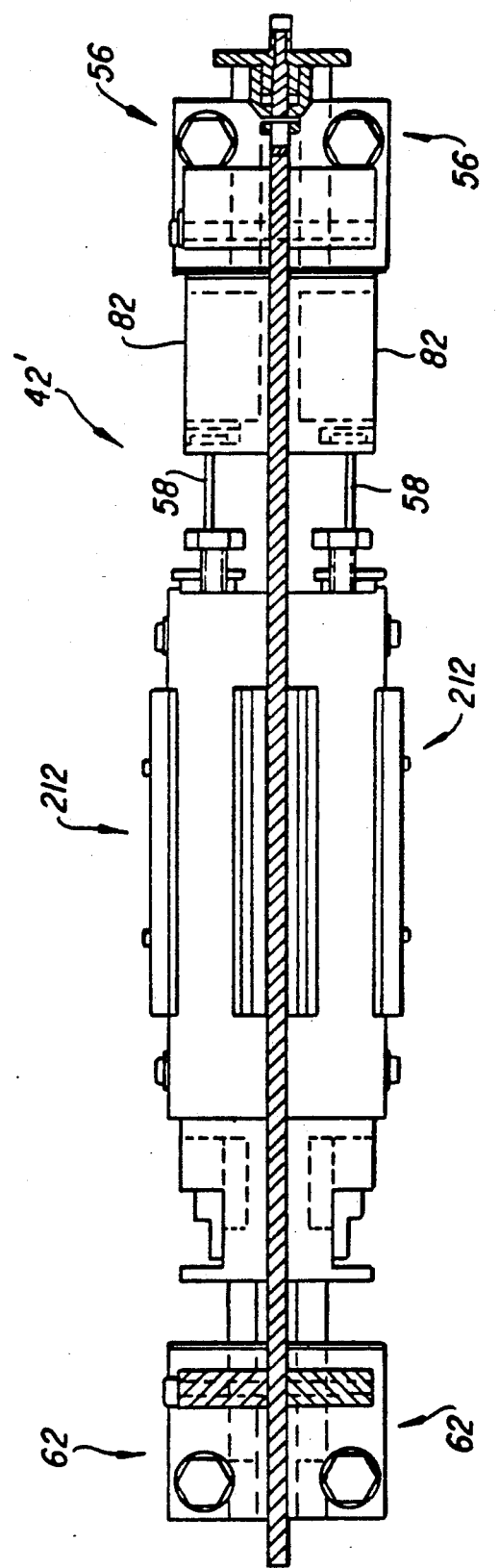
FIG. 9 is front elevation view of an alternate embodiment of a tray assembly according to the present invention.

Although the present invention has been described as including a single row of chambers 212, it should be appreciated that chambers 212 can be located on both sides of the tray assembly as shown in FIG. 9.

While a "double-D" tip 210 for the double barreled syringe is preferred for use with the present invention because a minimum surface area is provided, protein/precipitating solutions of approximately 50 microliters or greater are unstable when the tray assembly is accelerated or decelerated. To remedy this situation, a syringe tip 212' with a round end is provided as shown in FIG. 8'. This configuration increases the surface area of the end of tip 212', which thus increases the stability of drops in the 50-80 microliter range during acceleration and deceleration.

By use of refrigerator-incubator module 12, from the time that the tray assemblies are installed until they are removed, these tray assemblies are in an environment where the temperature is controlled to a preset temperature plus or minus a tolerance. In addition, one or more temperature sensors (thermistors) are used to measure the temperatures during growing at preselected intervals (from every few minutes to longer periods as desired). The sensors are connected to a battery powered temperature logger which is preferably attached to the top side of the bottom of the carrier assembly. The temperature logger is set to record nine temperatures at 5 minute intervals. With its data storage capability, it can record these parameters for 15.6 days. If the interval is decreased the number of days decrease and vice versa.

The use of tray assemblies in a carrier assembly allows the tray assemblies to be easily pulled out of the carrier assembly when desired. Furthermore, the use of the ball bearing slides reduces the chance of separating the protein/precipitating agent solutions from the syringe tips when the tray assemblies are moved in and out. Such ball bearing slides reduce the force required to overcome static friction, which frequently ca produce an acceleration followed by deceleration as the force decreases to an amount required to just overcome running or dynamic friction. Thus, with the ball bearing slides, the tray is moved at a nearly constant velocity and acceleration followed by deceleration which can separate the solutions from the tips is minimized.

Both ganging means 56 and 62 provide an increased mechanical advantage to overcome the friction of moving 20 plug assemblies or 20 piston assemblies simultaneously. In addition, a precision movement of the syringe pistons is possible with these ganging means. This is important in providing a slow extrusion of the protein and precipitating solutions to greatly increase the likelihood that the protein/precipitating agent solution will adhere to the end of the syringe tip (as opposed to accelerating the pistons to such a final velocity that the solutions are shot out of the barrels). Obviously, in low gravity, a very small force is required to accelerate an object so that a slow extrusion is very important. The simultaneous operation of the syringes and plugs not only simplifies these respective operations but also reduces the time required to accomplish them.

As mentioned above, the syringes can be filled at locations other than the use site, and then transported to the use site with retainer means 164. Then, during installation, the assembly containing chambers 212 is simply removed from the tray assembly for insertion of the syringes.

While the present invention has been described with respect to exemplary embodiments thereof, it will be understood by those who are skilled in the art the various modifications can be effected within the scope and spirit of the invention.

We claim:

1. A macromolecular crystal growing system for growing crystals in both the gravity of earth and the low gravity of space comprising:
   at least one tray assembly;
   a carrier assembly including a tray receiver means for removably receiving said at least one tray assembly;
   a refrigeration-incubation module including a carrier receiver means for removably receiving said carrier assembly and a temperature control means for controlling the temperature of said carrier assembly when said carrier assembly is received in said carrier receiver means; and
   a cranking tool;
   said tray assembly including
   (a) a planar base,
   (b) a plurality of sealed chambers mounted to said base and extending along an axis, each said chamber having (i) a syringe containing a crystal growing solution and extending into one side of said chamber parallel to said base, said syringe including a barrel, a tip disposed in said chamber, a piston in said barrel, and a piston rod connected to each respective said piston and extending parallel to said base out of said chamber, (ii) a plug means for sealing said tip, said plug means including a plug rod extending into an opposite side of said chamber parallel to said base and toward said tip, a plug located on a proximal end of said plug rod which resiliently seals against said tip, and a distal end which is located outside of said chamber; and (iii) a reservoir material in said chamber containing a solution causing crystal growth when the crystal growing solution is extruded from said tip,
   (c) a first ganging means for moving said pistons of all of said syringes simultaneously comprising i) a first tiebar extending parallel to said axis and slidably mounted to said base for movement toward and away from said chambers, (ii) a first connecting means for connecting all of said piston rods to said first tiebar, (iii) a first moving means for moving said first tiebar toward and away from said chambers, said first moving means including a first longitudinal rack extending parallel to said axis and having a threaded end, two first rack blocks mounted to said base through which said first longitudinal rack extends and including a first pinion means for engaging said first longitudinal rack, a first lateral rack which extends from said first rack block to an attachment to said first tiebar and which also engages said first pinion means, a first screw block mounted to said base adjacent said threaded end of said first longitudinal rack, and a first rack screw threadably mounted in said first screw block and having a proximal end adapted for engagement with said cranking tool and a distal end which threadably mates with said threaded end of said first longitudinal rack, and
   (d) a second ganging means for moving said plugs for all of said syringes simultaneously comprising (i) a second tiebar extending parallel to said axis and slidably mounted to said base for movement toward and away from said chambers, (ii) a second connecting means for connecting all of said plug rods to said second tiebar, (iii) a second moving means for moving said second tiebar toward and away from said chambers, said second moving means including a second longitudinal rack extending parallel to said axis and having a threaded end, two second rack blocks mounted to said base through which said second longitudinal rack, and extends and including a second pinion means for engaging said second longitudinal rack, a second lateral rack which extends from said second rack block to an attachment to said second tiebar and which also engages said second pinion means, a second screw block mounted to said base adjacent said threaded end of said second longitudinal rack, and a second rack screw threadably mounted in said second screw block and having a proximal end adapted for engagement with said cranking took and a distal end which threadably mates with said threaded end of said second longitudinal rack.

2. A crystal growing system as claimed in claim 1 wherein said module includes a temperature logger system for periodically measuring the temperature of said tray assembly.

3. A crystal growing system as claimed in claim 1 wherein said chamber includes a viewing axis of said tip which is perpendicular to said planar base and which is provided by viewing windows on opposite sides of said chamber, a first through hole and a first sealing means for removably sealing said first through hole whereby access is provided to said tip, and a second through hole and a second sealing means for removably sealing said second through hole whereby access is provided to said reservoir.

4. A crystal growing system as claimed in claim 1 wherein said tray receiver means of said carrier assembly includes a pair of ball bearing slides, each said slide being mounted on an opposite side of said carrier assembly such that said tray assembly is mounted thereto and freely slidable into and out of said carrier assembly by movement with said slides.

5. A crystal growing system as claimed in claim 4 wherein said slide has an extended length outside of said carrier assembly which is greater than 150% of a length of said tray assembly.

6. A crystal growing system as claimed in claim 1 wherein said cranking tool includes a handle, an engagement member, and a slipping means connecting said handle to said engagement member for limiting the torque which is transmitted from said handle to said engagement member.

7. A crystal growing system as claimed in claim 1 wherein said plug rod includes a loading control means for forcing said plug against said tip with a pressure, said loading control means including a lost motion means between said distal end and said proximal end of said plug rod for providing a limited length of free travel between said distal end and said proximal end of said plug rod and a spring means which forces said proximal end away from said distal end with a predetermined force over the limited length of free travel of said free travel means.

8. A crystal growing system as claimed in claim 1 wherein said tray assembly includes a plurality of sealed chambers on each side of said planar base.

9. A crystal growing system as claimed in claim 1 and further including a transport assembly for each said syringe for transporting each said syringe to said chamber after said syringe is loaded with the crystal growing solution.

10. A crystal growing system as claimed in claim 9 wherein said transport assembly includes a resilient cap for said tip and a retainer means for preventing movement of said piston rods.

11. A crystal growing system as claimed in claim 1 wherein said second connecting means includes for each said plug rod: a lip on said second tiebar which engages a lip provided at the distal end of said plug rod when said second tiebar is moved away from said chamber; a pusher member provided on said second tiebar which pushes against the distal end of said plug rod as said second tiebar is moved toward said chambers; and a mounting means for mounting said pusher member for movement between an engaging position whereby said pusher member engages the distal end of said plug rod as said second tiebar is moved toward said chambers and a disengaged position whereby said pusher member is free from engagement with the distal end of said plug rod as said second tiebar is moved toward said chambers.

12. A crystal growing system as claimed in claim 7 wherein said second connecting means includes for each said plug rod: a lip on said second tiebar which engages a lip provided at the distal end of said plug rod when said second tiebar is moved away from said chamber; a pusher member provided on said second tiebar which pushes against the distal end of said plug rod as said second tiebar is moved toward said chambers; and a mounting means for mounting said pusher member for movement between an engaging position whereby said pusher member engages the distal end of said plug rod as said second tiebar is moved toward said chambers and a disengaged position whereby said pusher member is free from engagement with the distal end of said plug rod as said second tiebar is moved toward said chambers.

13. A crystal growing system as claimed in claim 3:

wherein said tray receiver means of said carrier assembly includes a pair of ball bearing slides, each said slide being mounted on an opposite side of said carrier assembly such that said tray assembly is mounted thereto and freely slidable into and out of said carrier assembly by movement with said slides and wherein said slide has an extended length outside of said carrier assembly which is greater than 150% of a length of said tray assembly;

wherein said cranking tool includes a handle, an engagement member, and a slipping means connecting said handle to said engagement member for limiting the torque which is transmitted from said handle to said engagement member;

wherein said plug rod includes a loading control means for forcing said plug against said tip with a pressure, said loading control means including a lost motion means between said distal end and said proximal end of said plug rod for providing a limited length of free travel between said distal end and said proximal end of said plug rod and a spring means which urges said proximal end away from said distal end with a predetermined force over the limited length of free travel of said free travel means; and wherein said second connecting means includes for each said plug rod: a lip on said second tiebar which engages a lip provided at the distal end of said plug rod when said second tiebar is moved away from said chamber; a pusher member provided on said second tiebar which pushes against the distal end of said plug rod as said second tiebar is moved toward said chambers; and a mounting means for mounting said pusher member for movement between an engaging position whereby said pusher member engages the distal end of said plug rod as said second tiebar is moved toward said chambers and a disengaged position whereby said pusher member is free from engagement with the distal end of said plug rod as said second tiebar is moved toward said chambers.

14. A crystal growing system as claimed in claim 1 wherein said syringe includes two adjacent barrels in which respective said pistons are disposed.

15. A crystal growing system as claimed in claim 14 wherein said syringe includes a tip having a double-D configuration.

16. A crystal growing system as claimed in claim 14 wherein said syringe includes a round ended tip.

17. A crystal growing system as claimed in claim 1 wherein said chamber includes a viewing axis of said tip which is perpendicular to said planar base and which is provided by viewing windows on opposite sides of said chamber, one of said viewing chambers polarizing light passing into said chamber such that viewing is performed through the other said viewing window with a suitable complementary polarizing filter.

* * * * *